(12) United States Patent
Gao (10) Patent No.: US 10,980,154 B1
(45) Date of Patent: Apr. 13, 2021

(54) COOLING DESIGN FOR PCIE MOUNTED SERVER PERIPHERAL ELECTRONICS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/725,960

(22) Filed: Dec. 23, 2019

(51) Int. Cl.
*H05K 7/20* (2006.01)
*G06F 1/20* (2006.01)

(52) U.S. Cl.
CPC .......... *H05K 7/20636* (2013.01); *G06F 1/20* (2013.01); *G06F 2200/201* (2013.01)

(58) Field of Classification Search
None
See application file for complete search history.

(56) References Cited

U.S. PATENT DOCUMENTS

| | | | | |
|---|---|---|---|---|
| 8,358,505 B2* | 1/2013 | Toftloekke | ............ | H01L 23/473 361/703 |
| 8,441,789 B2* | 5/2013 | Wu | ............ | H05K 7/20754 361/679.49 |
| 10,299,413 B2* | 5/2019 | Cui | ............ | H01R 3/08 |
| 10,582,640 B2* | 3/2020 | Cader | ............ | H05K 7/20281 |
| 2007/0019384 A1* | 1/2007 | Berkenbush | ............ | H05K 7/2049 361/702 |
| 2008/0259566 A1* | 10/2008 | Fried | ............ | H05K 7/20809 361/699 |
| 2009/0080151 A1* | 3/2009 | Kalms | ............ | G06F 1/20 361/679.52 |
| 2009/0159241 A1* | 6/2009 | Lipp | ............ | F28F 9/002 165/80.2 |
| 2009/0161312 A1* | 6/2009 | Spearing | ............ | H05K 7/20772 361/679.47 |
| 2019/0150326 A1* | 5/2019 | Gao | ............ | H05K 7/20172 361/679.47 |
| 2019/0281730 A1* | 9/2019 | Gao | ............ | H05K 7/20272 |
| 2019/0327860 A1* | 10/2019 | Edwards | ............ | H05K 7/20836 |

* cited by examiner

*Primary Examiner* — Courtney L Smith
(74) *Attorney, Agent, or Firm* — Womble Bond Dickinson (US) LLP (57) ABSTRACT

A fluid cooling module (or system) for peripheral component interconnect express (PCIE) electronics housed within a chassis is disclosed. The system includes a mounting rail attached to a chassis, a cold/cooling plate having one or more mounting bolts attached to a side of the cold plate, the one or more mounting bolts to lock the cold plate to a fixing channel of the mounting rail to position a surface of the cold plate against a surface of the PCIE electronics, locking teeth of the fixing channels ensure a proper pressure being loaded horizontally on the PCIE electronics by the cold plate, and a fluid loop along a length of the mounting rail to circulate a fluid to the cold plate to cool the PCIE electronics.

20 Claims, 10 Drawing Sheets

COOLING DESIGN FOR PCIE MOUNTED SERVER PERIPHERAL ELECTRONICS

FIELD OF THE INVENTION

Embodiments of the present invention relate generally to electronics cooling. More particularly, embodiments of the invention relate to a method for designing and assembling liquid cooling hardware for a cooling design for peripheral component interconnect express (PCIE) mounted peripheral electronics.

BACKGROUND

Edge computing is an important technology in the artificially intelligence (AI) and 5G era. Edge computing devices will enable some level of local data processing and storage. Edge computing requires the deployment of IT equipment/electronics closer to the end users such as smart phones, autonomous vehicles, smart homes and so on. Thus, the environment of deployment may be different from a case to case basis. In a data center, the deployment environment is very well controlled, such that the servers are operating at desired thermal and humidity conditions. However, edge devices may be deployed in an outside environment, which directly exposes the computing devices to outside air, i.e., a condition not appropriate for operating these devices. In some other applications, the electronics may be deployed in a harsh environment. This may impact on the long term reliability and/or normal operating of these electronics.

Previous attempts use traditional air cooling for the edge computing devices/electronics similar to an air cooling solution for IT equipment. Some shortfalls of air cooling include a limited cooling and exposing the electronics to the ambient environment may impact the operations and reliability of the electronics. Most of the current edge computing devices are designed using natural conduction cooling. However, this is only feasible for low power design devices. For higher power density devices, the surface temperature may exceed a design limit or the devices may not work properly.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to an aspect, a fluid cooling system includes a mounting rail attached to a first side panel and a second side panel of the chassis, the first panel and second side panel being opposite side panels; a cold plate having one or more mounting bolts attached to a side of the cold plate, the one or more mounting bolts to lock the cold plate to the mounting rail to position a surface of the cold plate against a surface of the peripheral electronics mounted on a motherboard within the chassis; a fluid supply line disposed on the mounting rail to receive cooling fluid from an external fluid source and to supply the cooling fluid to the cold plate; and a fluid return line disposed on the mounting rail to return the cooling fluid from the cold plate to the external fluid source, wherein the fluid supply line and fluid line form a fluid loop to circulate the cooling fluid to the cold plate to cool the peripheral electronics.

In one embodiment, the mounting rail includes a mounting frame, the mounting frame is attached the chassis, and a mounting rail attached to a length of the mounting frame, where the one or more mounting bolts of the cold plate is to slide along a fixing channel of the mounting rail. In one embodiment, the mounting frame is attached to two side panels of the chassis or a bottom panel of the chassis.

In one embodiment, the mounting rail is pre-assembled and fixedly attached to the chassis or the mounting rail is attached to the chassis based on a lock mechanism after the chassis is assembled and the PCIE electronics are assembled on the chassis. In one embodiment, the PCIE electronics is not required to have mounting holes to mount the cold plate to the PCIE electronics, where the cold plate is pressured against the PCIE electronics and the pressured (e.g., a threshold of loading pressure) is supported by the cold plate attached to the mounting rail.

In one embodiment, two opposing surfaces of the PCIE electronics are sandwiched between the cold plate and another cold plate to cool the opposing surfaces of the PCIE electronics. In one embodiment, opposing surfaces of the PCIE electronics are sandwiched between the cold plate and a mounting plate, wherein the mounting plate includes one or more mounting bolts attached to a side of the mounting plate and the one or more mounting bolts of the mounting plate is locked to the mounting rail to support the PCIE electronics being pressed against a surface of the cold plate to cool the PCIE electronics.

In one embodiment, the fixing channel of the mounting rail is an elongated fixing channel long a length of the mounting rail. In another embodiment, each of the one or more mounting bolts of a cold plate includes an elliptical head portion that turns at least 90 degrees to activate or deactivate a first locking mechanism, wherein if deactivated, the elliptical head portion is insertable through the fixing channel of the mounting rail, wherein if activated and the elliptical head portion is inserted through the fixing channel, the elliptical head portion locks the mounting bolt of the cold plate in the fixing channel for a neck portion of the mounting bolt to slide along the fixing channel.

In one embodiment, the fixing channel of the mounting rail has a number of teeth or serrated edges along one side along a length of the fixing channel. In one embodiment, each of the serrated edges is directional for a neck portion of a mounting bolt of the cold plate to freely slide in only one direction along the fixing channel of the mounting rail. In one embodiment, the serrated edges for the fixing channels and portions of the mounting rail can be modular. In one embodiment, a mounting rail can include two modular portions, each of the serrated edges is in a first directional for a first portion of the mounting rail and each of the serrated edges is in a second direction for a second portion of the mounting rail.

The serrated edges can lock a cold plate in position for a non-slid-able direction, while sliding the cold plate along the fixing channel along a slid-able direction can guide the cold plate to a particular location of chips, GPU, a printed circuit board (PCB), or any other components, of the PCIE electronics. For example, for a dual-module mounting rail, an operator can slide a first plate along a first fixing channel in a first direction (e.g., a plate base surface slides towards a surface of the PCIE electronics) and a second plate (cooling plate or mounting plate, which can have a similar physical structure to a cold plate but for the purpose of mounting support, e.g., without fluid running through the mounting plate) slides along a second fixing channel in a second direction (e.g., a plate base surface of the second plate slides towards an opposing surface of the PCIE electronics).

The neck portions of the plates are directionally locked to the fixing channel(s) of the mounting rail via sliding along the directional serrated edges of the fixing channels and mounting pressure is applied from the plates to the surfaces of the PCIE electronics. The required mounting pressure applying the one or more (cold or mounting) plates to the PCIE electronics surfaces is provided by the plates being tightly locked to the mounting rail. Once the mounting pressure is loaded to the cold plate and the PCIE electronics, the serrated edges of the fixing channels against a neck portions of the plates provide and maintain a proper pressure. In another embodiment, the mounting pressure is loaded to the cold plate and the PCIE electronics via the head portion of the mounting bolts locked against a fixing channel of the mounting rail.

In one embodiment, the fixing channel of the mounting rail has opposing serrated edges facing opposing sides of the fixing channel. In one embodiment, the mounting rail further includes an unlocking mechanism to release the serrated edges so a mounting bolt of a cold plate is removable from the fixing channel. With the serrated edges released, an operator can adjust the mounting bolts to de-insert the mounting bolts from the fixing channel and to detach the cold plate from the mounting rail. In another embodiment, the mounting bolts when adjusted can be de-inserted through the fixing channel having the serrated edges without releasing the serrated edges. Either way, the cold plates is removable from the motherboards, devices or chips, etc.

In one embodiment, the cold plate is secured to the PCIE electronics by applying a force to the cold plate for the one or more mounting bolts of the cold plate to slide along a direction of the serration (serrated edges) for the cold plate to be secured to the PCIE electronics. This securing mechanism also provides a proper mounting pressure to load the cold plate to the chip/processor. The goal is to ensure that a base surface of the cold plate is fully in contact with the processor (reducing thermal resistance) to ensure a proper thermal function. In one embodiment, the one or more mounting bolts of a respective cold plate are pre-assembled to the cold plate.

In one embodiment, one or more mounting structures attached to the chassis for the mounting rail to be secured to the mounting structures. In one embodiment, the chassis forms a fully enclosed environment such that no external air is exchanged with air internal to the enclosed environment.

In one embodiment, the system further includes a fluid distribution unit coupled to the chassis, where the fluid distribution unit includes a fluid inlet, a fluid outlet, and a fluid distribution channel coupled to the fluid inlet and the fluid outlet, the fluid distribution channel to distribute a fluid from the fluid inlet and the fluid outlet. In one embodiment, the fluid loop is coupled to a fluid distribution channel of the fluid distribution unit.

The disclosed systems can be used for electronics packages/edge computing devices and/or IT equipment in data centers. In some cases, the electronics packages may be mobile. Note that although a PCIE device is utilized as an example of an electronic device throughout this application, however, the cooling techniques can also be applied to other electronic devices.

Figure 1:
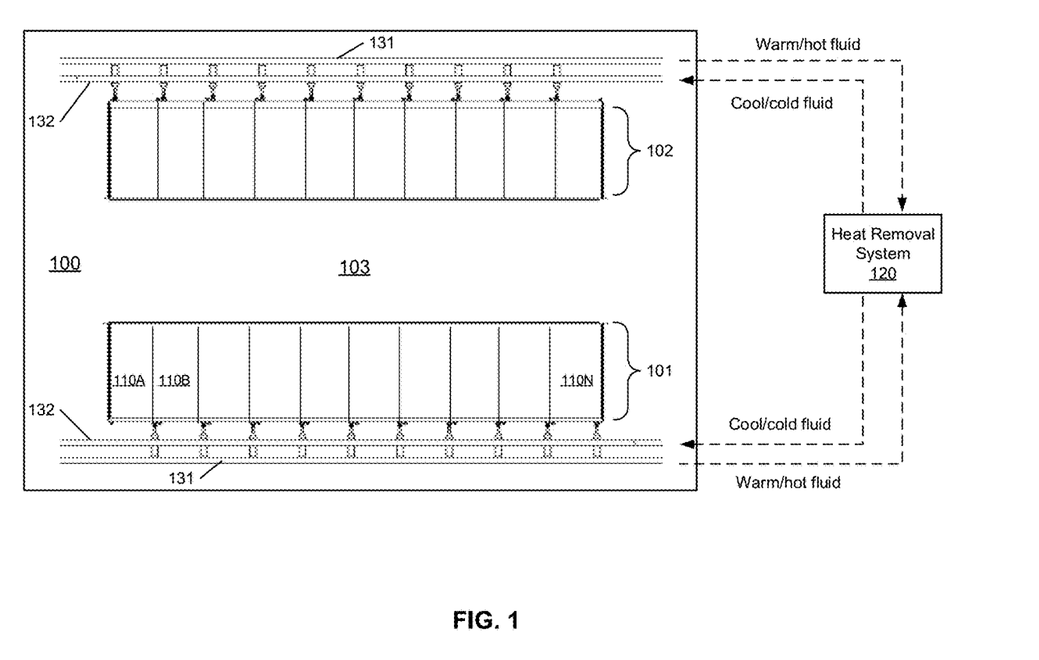
FIG. 1 is a block diagram illustrating an example of a data center facility according to one embodiment. (will it be a better idea to move the FIG. 1 and FIG. 2 to the end?)

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. Note that the heat removal system 120 may be coupled to multiple data center systems such as data center system 400.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed/circulated/recirculated through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

According to one embodiment, each of the electronic racks includes an optional rack management unit (RMU) coupled to the CDU and each of the computing nodes of the electronic rack (not shown). The RMC periodically or constantly monitors operating status of the CDU, and computing nodes. The operating data of the operating status may include the operating temperatures of each processor, cooling liquid, etc. measured at real time. Based on the operating data received from various components, the RMU performs an optimization using an optimization function to determine the optimal pump speed of a liquid pump of the CDU, such that the power consumption of the liquid reaches minimum, while the liquid pump are operating properly according to their respective specifications (e.g., the speeds of the liquid pump are within their respective predefined ranges).

That is, the optimization is performed at a global level by optimizing all components involved simultaneously, such that 1) the temperatures of the processors are below their respective reference temperatures, 2) the total power consumption by the liquid pump reaches minimum, and 3) each of the liquid pump operates within their respective specification. The optimal pump speed is then utilized to configure the liquid pump. As a result, the total power consumption by the liquid pump reaches minimum while the processors of the computing nodes operate properly.

Figure 2:
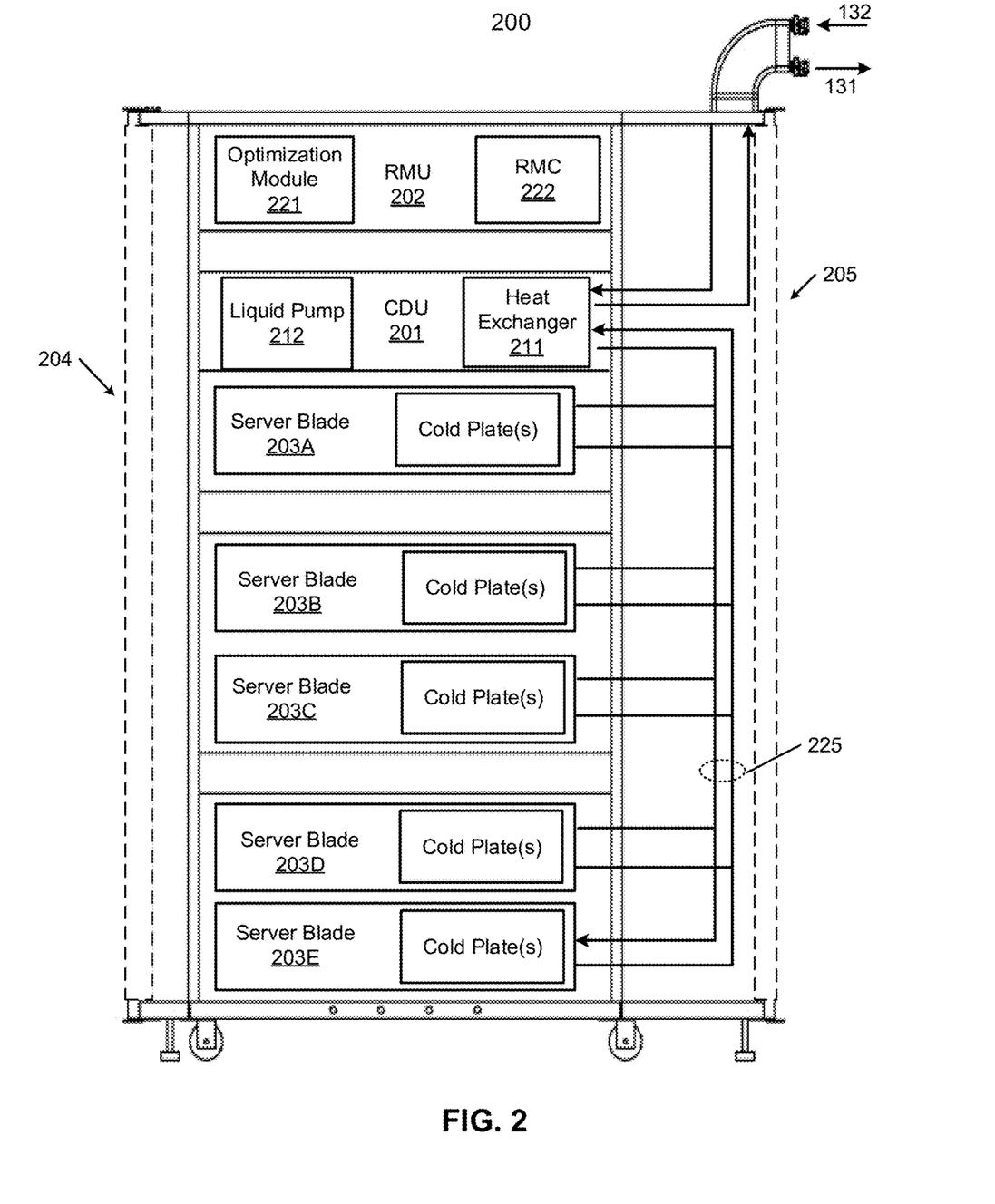
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container. In another embodiment, electronic rack 200 can be fully contained and not exposed to the environment.

In one embodiment, CDU 701 mainly includes heat exchanger 711, liquid pump 712, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations. The one or more compute servers may be edge compute servers having a motherboard and electronics horizontal mounted on the motherboard such as CPU/GPU electronics and electronics vertical mounted components, such as component vertically mounted on a PCIE expansion bus of a motherboard. These component may be memory modules, accelerators, or any other electronic components.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, and CDU 201. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the pump power generated by the liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive an optimal pump speed for liquid pump 212, such that the total power consumption of liquid pump 212 reaches minimum, while the operating data associated with liquid pump 212 is within their respective designed specifications. Once the optimal pump speed has been determined, RMC 222 configures liquid pump 212 based on the optimal pump speeds.

Figure 3:
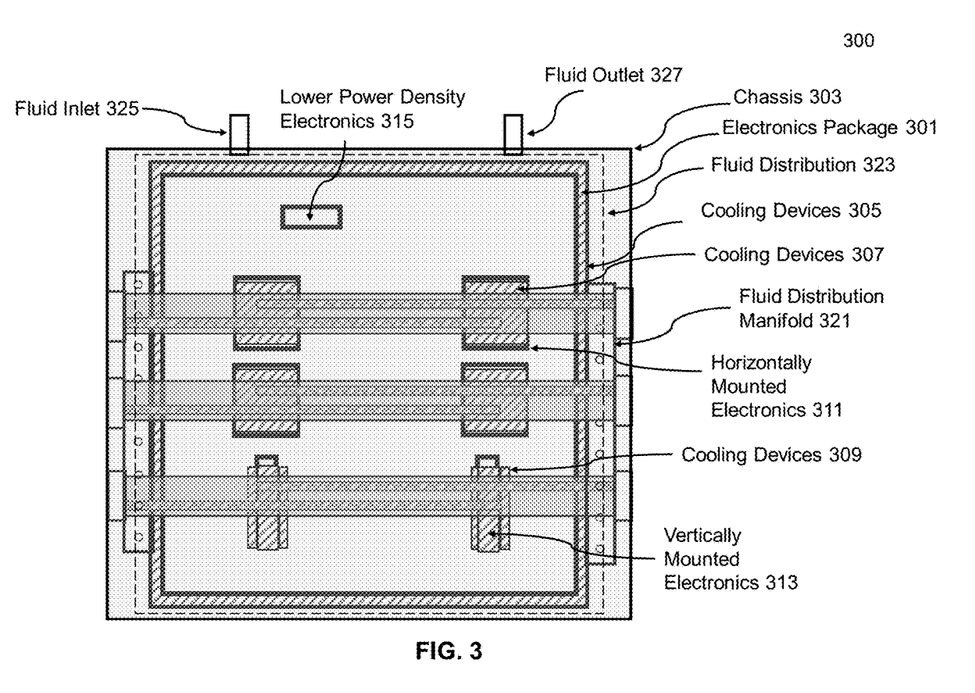
FIG. 3 is a block diagram illustrating a top view of a fluid cooling enclosure/chassis for an enclosed electronic package (EEP) according to one embodiment.

FIG. 3 is a block diagram illustrating a top view of a fluid cooling enclosure/chassis for an enclosed electronic package (EEP) according to one embodiment. Referring to FIG. 3, fluid cooling system 300 for an electronics package 301 held in a chassis 303 is disclosed. The electronics package can be enclosed/air-tight sealed within the chassis. The cooling system 300 includes a number of cooling devices/modules 305-309 for different types of electronics, both vertically mounted electronics 313 and horizontally mounted electronics 311. These cooling devices 305, 307, 309 are used for cooling heat generating electronics 311-315 including low density electronics 315 and high power density electronics 311-313.

In one embodiment, the cooling devices are cooling plates or mounting plates. For low power density electronics 315, their heat can be cooled by natural convection and/or a board cooling device (e.g., a board cooling plate) 305. The cooling system 300 can include a fluid distribution manifold 321 and/or fluid distribution/piping 323. The fluid distribution manifold 321 is used to distributing fluid to the cooling devices. The fluid distribution manifold 321 is coupled to the fluid inlet 325 and fluid outlet 327 for fluid to flow in and out of the fluid distribution manifold 321 respectively. The cooling system 300 can provide a fluid cooling design for the entire enclosure at the same time, provides a high separation of the fluid parts with the electronics. The vertically mounted electronics can be PCIE electronics mounted on a PCIE expansion bus.

Currently, there is no solution or a mature solution to implement a chassis level fluid cooling for vertically mounted electronics, such as electronics mounted to a PCI-E expansion bus. In addition, most of the components mounted in this manner such as GPU cards, graphics adapter cards, network interface cards (NICs), storage accelerator devices, solid state drives (SSD) and other high-performance peripherals may have different form factors. This means that a cooling solution should be independent of the component form factors.

A fluid cooling system is disclosed to cool vertically mounted PCIE electronics such as PCIE hardware components and/or GPU cards. In one embodiment, the system includes a mounting rail for mounting and fixing of cold plates. The system can include one or more cold plates pressed against one or more surfaces of the PCIE electronics. Each cold plate includes one or more mounting bolts to fix the cold plate onto the mounting rail. In one embodiment, the mounting rail includes one or more channels (e.g., fixing channels) with locking/teeth which are used to fix a cold plate location. Also, the one or more channels can load proper mounting pressure to the vertically mounted electronics. The mounting rail further includes one or more fluid channels for fluid loops to supply a fluid to and from the cold plates.

The mounting rail can be pre-assembled with the chassis or installed onto a mounting frame of the chassis after a motherboard and PCIE components of an electronic package are assembled. The mounting rail is thus structurally supported by the chassis.

Figure 4:
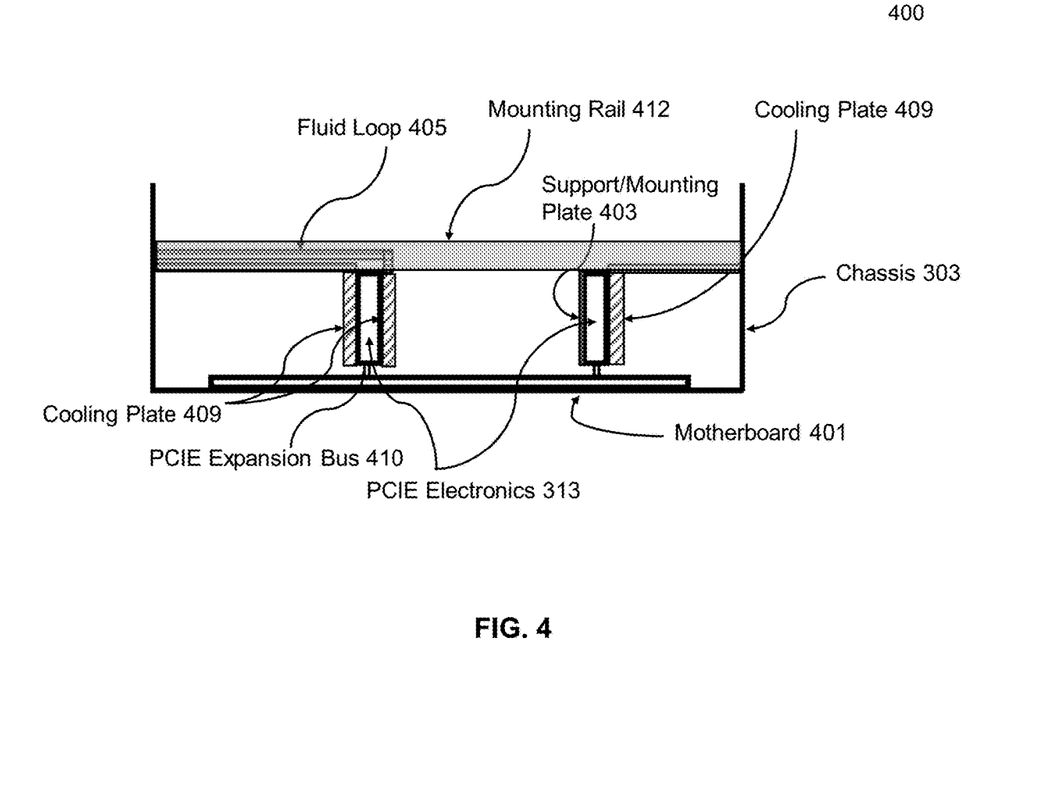
FIG. 4 is a block diagram illustrating a side view for a fluid cooling system to cool PCIE devices for an EEP according to one embodiment.

FIG. 4 is a block diagram illustrating a side view for a fluid cooling system to cool PCIE electronics for an EEP according to one embodiment. FIG. 4 shows a cooling system 400 for PCIE electronics mounted on a PCIE expansion bus 410. Cooling system 400 can be part of (e.g., a cooling system for the vertically mounted electronics) cooling system 300 of FIG. 3. Referring to FIG. 4, system 400 includes a mounting rail 412. The mounting rail 412 can be assembled and fixed on one or more side panels or a bottom panel of a chassis 303. The cold plates 409 and/or mounting plates 403 are used on either one side or double sides of the PCIE electronics 313 to cool the PCIE electronics 313. If one side of cold plate is used, the other side can include a mounting plate for pressure loading purposes. The cold plate can then be installed and fixed on the mounting rail 412 and attached to the electronics component with a proper loading pressure. The fluid loops 405 can then be assembled on top or in a fluid channel of the mounting rail 412.

In this implementation, no design changes are required for the PCIE components or chassis hardware or a motherboard of an electronic packages. The mounting rail provides a reliable structure for assembling of the cold plates to the PCIE component.

Figure 5:
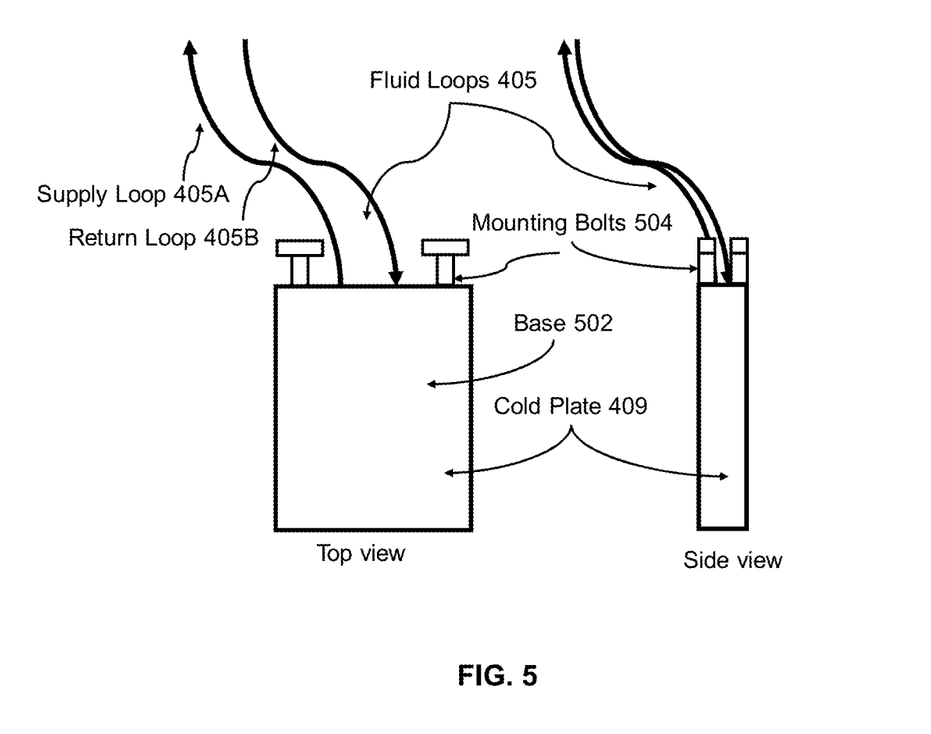
FIG. 5 is a block diagram illustrating a fluid cold/cooling plate used to cool PCIE devices for an EEP according to one embodiment.

FIG. 5 is a block diagram illustrating a fluid cold plate (both top view and side view) used to cool PCIE devices for an EEP according to one embodiment. FIG. 5 shows the cold plate 409 includes a base body 502, fluid inlet and outlet (not shown) and one or more mounting bolts 504. In one embodiment, the cold plate includes four mounting bolts 504 to mount to a mounting rail having two fixing channels. The mounting bolts 504 can be preassembled onto the cold plate base body 502. In one embodiment, the locations of these bolts 504 on the cold plate base body 502 may be adjustable, such as, through screw threads (not shown) on the bolts and the base body. In one embodiment, a head portion of the bolts is elliptically shaped. In one embodiment, the head portions of the bolts are able to turn 90 degrees in clockwise or counterclockwise directions. The bolt design is to facilitate the installation of the cold plate onto a fixing channel of the mounting rail. It should be mentioned that other type of designs can be also used to achieve a similar result. The cold plate base body 502 is coupled to fluid supply/return loops 405 to circulate fluid through the base body 502.

Figure 6:
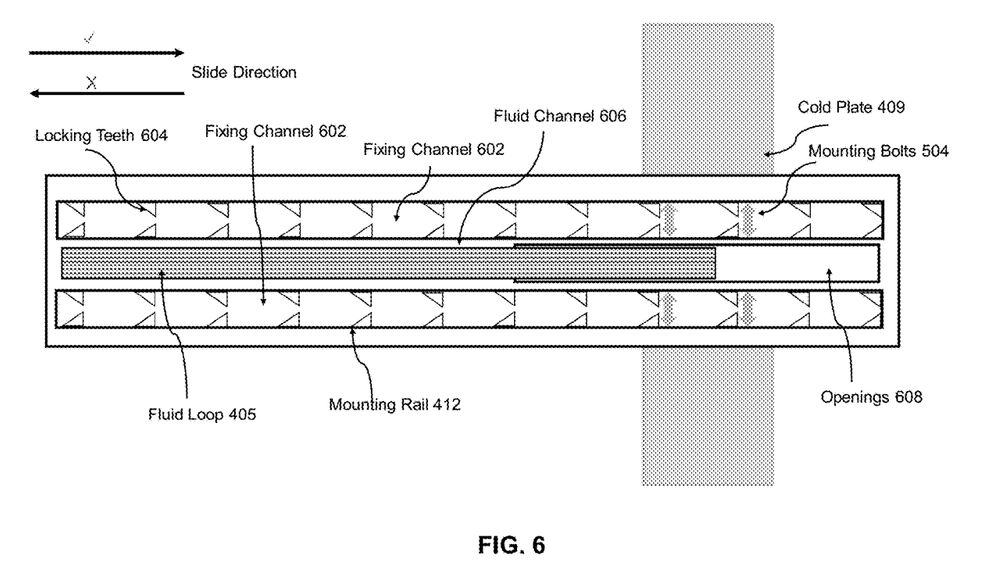
FIG. 6 is a block diagram illustrating a top view for a mounting rail for an EEP according to one embodiment.

FIG. 6 is a block diagram illustrating a top view of a mounting rail for an EEP according to one embodiment. FIG. 6 shows a mounting rail 412 when a cold plate 409 is assembled to it. FIG. 6 illustrates two fixing channels 602 for the mounting rail 412. A cold plate 409 is fixed onto the mounting rail 412 using four mounting bolts 504 as a locking mechanism. In one embodiment, for each fixing channel 602, multiple serrated edges/locking teeth 604 are assembled within one or both edges of the fixing channel. The function of the locking teeth 604 is to allow a mounting bolt 504 to move or slide in the fixing channel 602 in one direction but not the opposing direction. The directional movement allows an operator to slide the mounting bolt in one direction moving a cold plate 409 corresponding to the mounting bolt 504 towards a surface of the PCIE components (or electronics) during installation. This way, the locking teeth 604 prevents the cold plate and the mounting bolts from moving away from the PCIE components. Since, there are many locking teeth 604 within the fixing channel 602, therefore a position of the cold plate 409 can be finely adjusted.

When an operator assembles cold plates 409 (or mounting plates) on both sides of the PCIE components, a proper loading pressure can be applied to the PCIE electronic component by pushing the two sides closer to each other and the pressure can be maintained by these locking teeth 604. In one embodiment, the mounting rail 412 includes one or more fluid channels 606. In one embodiment, a fluid loop 405 goes through an opening 608 of the mounting rail 412 and assembled in a fluid channel 606 of the mounting rail 412. It needs to be mentioned that, although it is shown in FIG. 6 a mounting rail 412 with two fixing channels 602 fixed to a cold plate 409 having four mounting bolts 504, the numbers of fixing channels and mounting rails can vary. Four mounting bolts is used as an example, however, the number of mounting bolts can vary.

In one embodiment, a head portion of a mounting bolt is elliptical shaped so a head portion can be turned and aligned with a fixing channel so an operator can insert the elliptical heads through the fixing channel for a neck portion of the mounting bolt to be engaged with the fixing channel. In one embodiment, a head portion of the mounting bolt can be turned 90 degrees to fix the head portion of the mounting bolt against the fixing channel. In another embodiment, once a cold plate and/or a mounting plate is moved to a certain location, a head portion of the mounting bolt can be turned 90 degrees to fully fix the mounting bolt and the cold plate to the mounting rail. In one embodiment, the head portion of a mounting bolt can be designed using multiple parts for different functions, such as a first portion designed in an elliptical shape for mounting purpose, a second portion designed with a screw for tightening purpose.

Figure 7:
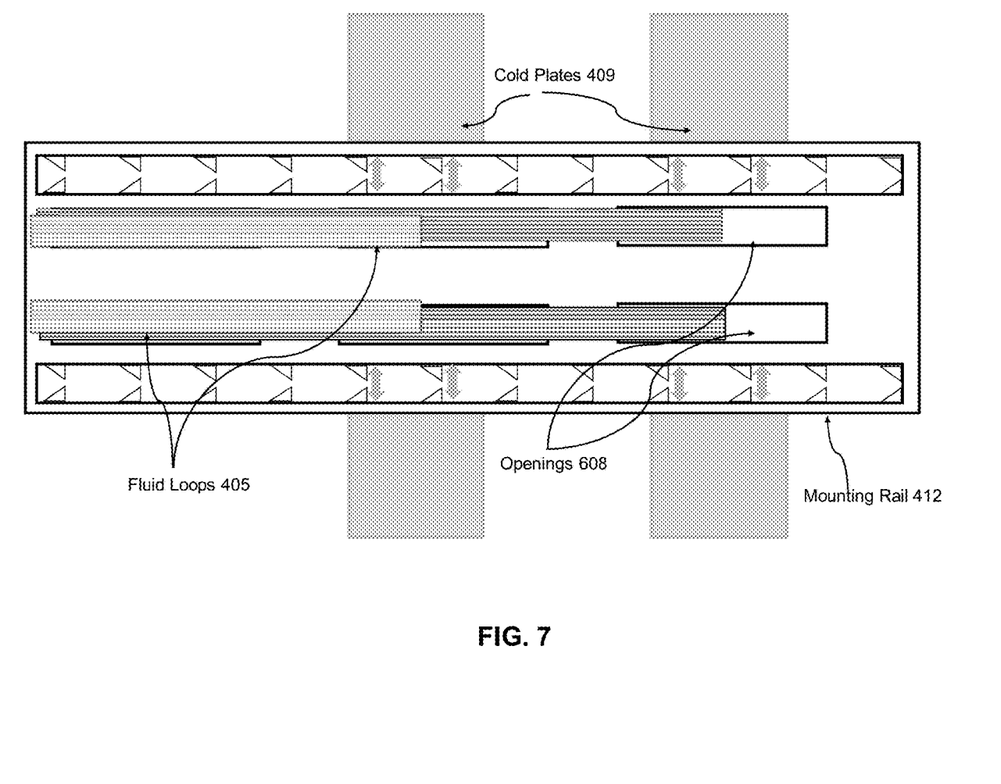
FIG. 7 is a block diagram illustrating a top view for a mounting rail for an EEP according to another embodiment.

FIG. 7 is a block diagram illustrating a top view for a mounting rail for an EEP according to another embodiment. FIG. 7 show a top view of the mounting rail 412 with two cold plates 409 assembled onto the mounting rail 412, where the mounting rail 412 has two openings 608. It can be seen that each of the openings 608 can be used as a fluid channel for fluid loops 405 for a particular cold plate.

Figure 8:
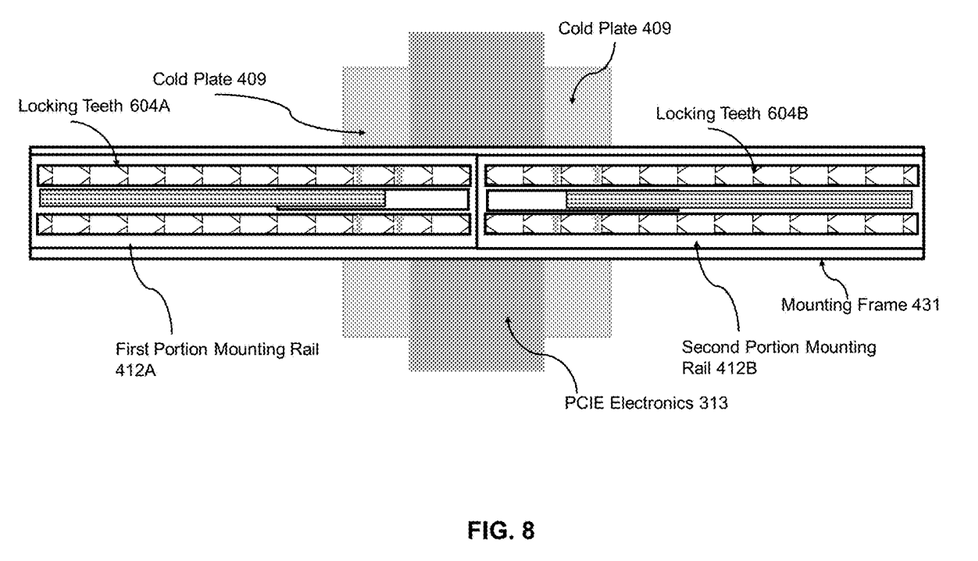
FIG. 8 is a block diagram illustrating a top view for a mounting rail for an EEP according to another embodiment.

FIG. 8 is a block diagram illustrating a top view for a mounting rail for an EEP according to another embodiment. FIG. 8 shows a mounting rail 412 having two modular portions 412A-412B. A first modular portion 412A of the mounting rail is assembled with a first cold plate 409, the first portion having locking teeth 604A of a first direction. A second modular portion 412B of the mounting rail is assembled with a second cold plate 409, the second portion having locking teeth 604B of a second direction. This way, an operator can press both cold plates 409 together to sandwich the PCIE electronics 313. Although only two modular portions 412A-412B are shown, the mounting rail 412 can include any number of modular portions. The mounting rail 412 can be pre-assembled with the chassis or installed onto a mounting frame 431.

Figure 9:
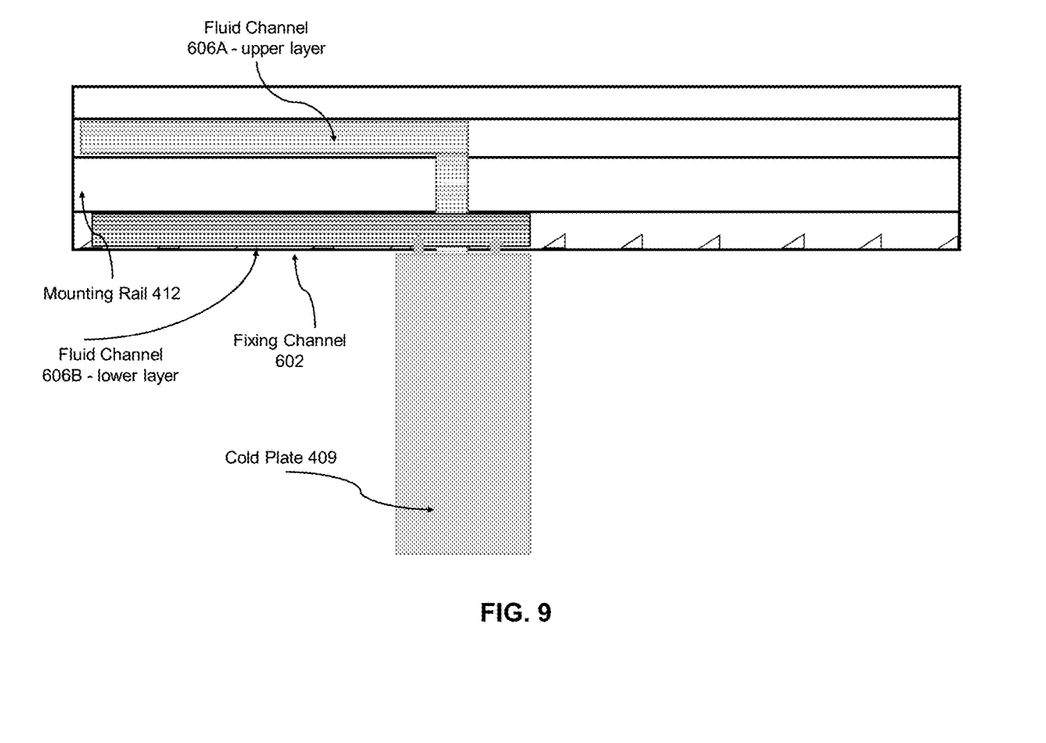
FIG. 9 is a block diagram illustrating a side view for a fluid mounting system for an EEP according to another embodiment.

FIG. 9 is a block diagram illustrating a side view for a fluid mounting system for an EEP according to another embodiment. In one embodiment, an opening of a mounting rail can include one or more fluid channels (that is layered). FIG. 9 shows a mounting rail 412 with two layers for an opening for two fluid channels 606A-606B. This is useful as an operator can place fluid loops 405 for one or more cold plates 409 in different layers of the openings when there are multiple cold plates 409 assembled to a mounting rail 412. In one embodiment, one cold plate 409 can use two layers of opening, one for a supply loop and one for a return loop for the cold plate.

Figure 10:
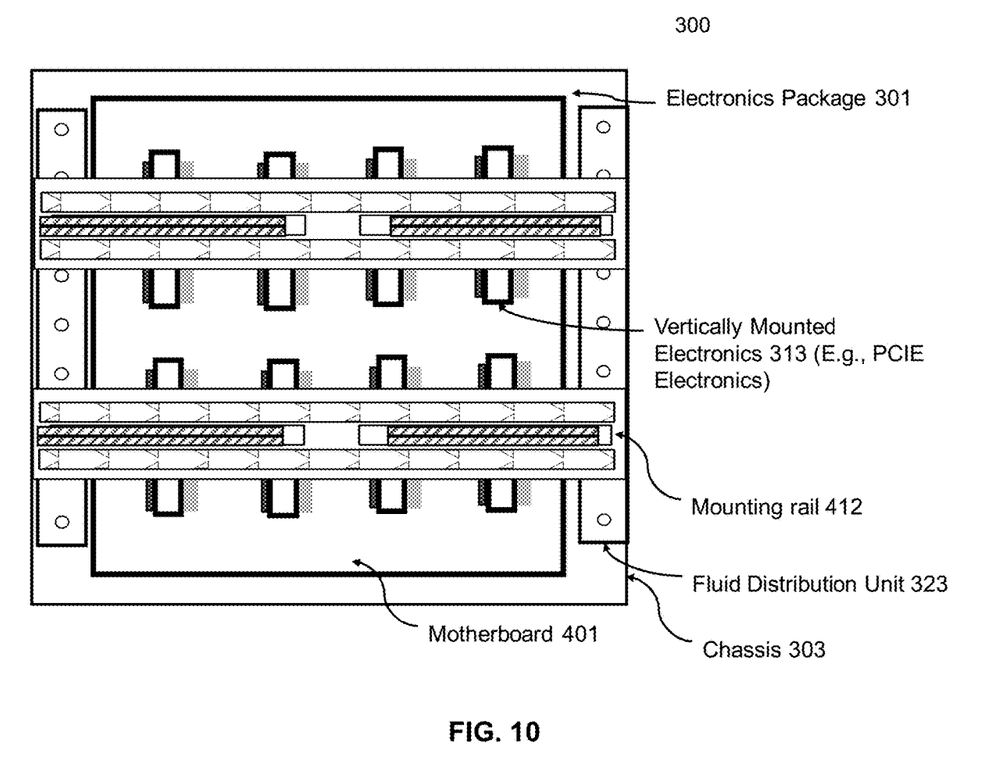
FIG. 10 is a block diagram illustrating a top view for a fluid mounting system to cool PCIE devices for an EEP according to one embodiment.

FIG. 10 is a block diagram illustrating a top view for a fluid mounting system to cool PCIE devices for an EEP according to one embodiment. FIG. 10 shows a fluid cooling system 300 for an electronics package 301 (having a motherboard 401) within a chassis 303, the electronics package having multiple vertically mounted electronics 313, e.g., PCIE mounted electronics. FIG. 10 shows two mounting rails 412 are used within the chassis 303. One or more cold plates/mounting support plates are fixed to locking teeth of the mounting rail 412. The cold plates/mounting support plates are fixed at a position having horizontal pressure applied to sandwich one or more PCIE electronics 313. The pressure is applied by way of the locking teeth, and fixing channel. It should be mentioned that fluid loops of the cooling plates are coupled to a fluid distribution unit for the fluid distribution unit 323 to circulate cool fluid to the cooling plates and warm fluid away from the cooling plates. The electronics package can be air-tight and enclosed with fluid inlets and outlets to circulate fluid.

Again although a PCIE device is utilized as an example of an electronic device throughout this application, however, the cooling techniques can also be applied to other electronic devices, such as a microprocessor (e.g., central processing unit or CPU), a general-purpose processor (GPU), an application specific integrated circuit (ASIC), or a field programmable gate array (FPGA), etc.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A fluid cooling system for peripheral electronics housed within a chassis, the fluid cooling system comprising:
a mounting rail attached to a first side panel and a second side panel of the chassis, the first panel and second side panel being opposite side panels;
a cold plate having one or more mounting bolts attached to a side of the cold plate, the one or more mounting bolts to lock the cold plate to the mounting rail to position a surface of the cold plate against a surface of the peripheral electronics mounted on a motherboard within the chassis, wherein each of the one or more bolts includes an elliptical head portion;
a fluid supply line disposed on the mounting rail to receive cooling fluid from an external fluid source and to supply the cooling fluid to the cold plate; and
a fluid return line disposed on the mounting rail to return the cooling fluid from the cold plate to the external fluid source, wherein the fluid supply line and fluid return line form a fluid loop to circulate the cooling fluid to the cold plate to cool the peripheral electronics.

2. The system of claim 1, wherein the mounting rail includes a mounting frame attached the chassis, wherein the mounting rail attached to a length of the mounting frame, wherein the one or more mounting bolts of the cold plate is to slide along a fixing channel of the mounting rail.

3. The system of claim 2, wherein the mounting frame is attached to the first and second side panels of the chassis or a bottom panel of the chassis.

4. The system of claim 1, wherein the mounting rail is pre-assembled and fixedly attached to the chassis or the mounting rail is attached to the chassis based on a lock mechanism after the chassis is assembled and the peripheral electronics are assembled on the chassis.

5. The system of claim 1, wherein the peripheral electronics is not required to have mounting holes to mount the cold plate to the peripheral electronics, where the cold plate is pressured against the peripheral electronics and the pressured is supported by the cold plate attached to the mounting rail.

6. The system of claim 1, wherein two opposing surfaces of the peripheral electronics are sandwiched between the cold plate and another cold plate for the cold plate and the another cold plate to extract heat from the opposing surfaces of the peripheral electronics.

7. The system of claim 1, wherein opposing surfaces of the peripheral electronics are sandwiched between the cold plate and a mounting plate, wherein the mounting plate includes one or more mounting bolts attached to a side of the mounting plate and the one or more mounting bolts of the mounting plate is locked to the mounting rail to lock a force horizontally to support the peripheral electronics being pressed against a surface of the cold plate to cool the peripheral electronics.

8. The system of claim 2, wherein the fixing channel of the mounting rail is an elongated fixing channel along a length of the mounting rail.

9. The system of claim 1, wherein each of the one or more mounting bolts of the cold plate includes the elliptical head portion that turns at least 90 degrees to activate or deactivate a first locking mechanism, wherein if deactivated, the elliptical head portion is insertable through the fixing channel of the mounting rail, wherein if activated and the elliptical head portion is inserted through the fixing channel, the elliptical head portion locks the mounting bolt of the cold plate in the fixing channel for a neck portion of the mounting bolt to slide along the fixing channel.

10. The system of claim 9, wherein the fixing channel of the mounting rail includes a plurality of serrated edges along one side along a length of the fixing channel.

11. The system of claim 10, wherein each of the serrated edges is directional for a neck portion of a mounting bolt of a cold plate to freely slide in only one direction along the fixing channel of the mounting rail.

12. The system of claim 10, wherein each of the serrated edges is in a first directional for a first portion of the mounting rail and each of the serrated edges is in a second direction for a second portion of the mounting rail.

13. The system of claim 11, wherein the fixing channel of the mounting rail includes opposing serrated edges facing opposing sides of the fixing channel.

14. The system of claim 13, wherein the mounting rail further comprises an unlocking mechanism to unlock the serrated edges so a mounting bolt of a cold plate is removable from the fixing channel.

15. The system of claim 14, wherein the cold plate is secured to the peripheral electronics by applying a force to the cold plate for the one or more mounting bolts of the cold plate to slide along a direction of the serration for the cold plate to be secured to the peripheral electronics.

16. The system of claim 1, wherein the one or more mounting bolts of a respective cold plate are pre-assembled to the cold plate.

17. The system of claim 1, further comprising one or more mounting structures attached to the chassis for the mounting rail to be secured to the mounting structures.

18. The system of claim 1, wherein the mounting rail further comprises: one or more fluid channels channeling a fluid loop along the mounting rail and one or more openings to access the fluid channels and/or the fluid loop.

19. A data processing system housed within a chassis, comprising:
a motherboard;
a central processing unit (CPU) mounted on the motherboard;
peripheral electronics mounted on the motherboard;
a mounting rail attached to a first side panel and a second side panel of the chassis, the first panel and second side panel being opposite side panels;
a cold plate having one or more mounting bolts attached to a side of the cold plate, the one or more mounting bolts to lock the cold plate to the mounting rail to position a surface of the cold plate against a surface of the peripheral electronics, wherein each of the one or more bolts includes an elliptical head portion;
a fluid supply line disposed on the mounting rail to receive cooling fluid from an external fluid source and to supply the cooling fluid to the cold plate; and
a fluid return line disposed on the mounting rail to return the cooling fluid from the cold plate to the external fluid source, wherein the fluid supply line and fluid return line form a fluid loop to circulate the cooling fluid to the cold plate to cool the peripheral electronics.

20. An electronic rack of a data center, comprising:
an array of server blades arranged in a stack, each server blades including one or more servers housed within a chassis, each chassis comprises:
a motherboard;
a central processing unit (CPU) mounted on the motherboard;

peripheral electronics mounted on the motherboard;
a mounting rail attached to a first side panel and a second side panel of the chassis, the first panel and second side panel being opposite side panels;
a cold plate having one or more mounting bolts attached to a side of the cold plate, the one or more mounting bolts to lock the cold plate to the mounting rail to position a surface of the cold plate against a surface of the peripheral electronics, wherein each of the one or more bolts includes an elliptical head portion;
a fluid supply line disposed on the mounting rail to receive cooling fluid from an external fluid source and to supply the cooling fluid to the cold plate; and
a fluid return line disposed on the mounting rail to return the cooling fluid from the cold plate to the external fluid source, wherein the fluid supply line and fluid return line form a fluid loop to circulate the cooling fluid to the cold plate to cool the peripheral electronics.

\* \* \* \* \*